United States Patent
Tseng

(12) United States Patent     (10) Patent No.: US 7,223,667 B2
Tseng     (45) Date of Patent: May 29, 2007

(54) COMPENSATED LINEARITY VOLTAGE-CONTROL-CAPACITOR DEVICE BY STANDARD CMOS PROCESS

(75) Inventor: Bor-Min Tseng, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 266 days.

(21) Appl. No.: 10/828,884

(22) Filed: Apr. 21, 2004

(65) Prior Publication Data

US 2005/0239260 A1    Oct. 27, 2005

(51) Int. Cl.
*H01L 21/20*     (2006.01)

(52) U.S. Cl. ............... 438/379; 438/382; 257/595

(58) Field of Classification Search ........... 438/379, 438/382, 391; 257/288, 296, 300, 595, E29.344, 257/E27.049
See application file for complete search history.

(56) References Cited

U.S. PATENT DOCUMENTS

| | | | |
|---|---|---|---|
| 6,407,412 B1 | 6/2002 | Iniewski et al. | |
| 6,465,830 B2 | 10/2002 | Babcock et al. | |
| 6,521,939 B1* | 2/2003 | Yeo et al. | 257/312 |
| 6,878,983 B2* | 4/2005 | Coolbaugh et al. | 257/312 |
| 6,882,029 B1* | 4/2005 | Gau et al. | 257/595 |
| 6,943,399 B1* | 9/2005 | Gau | 257/312 |
| 2003/0082461 A1 | 5/2003 | Carpi | |
| 2003/0136992 A1* | 7/2003 | Adan | 257/300 |
| 2004/0188795 A1* | 9/2004 | Ohkubo et al. | 257/467 |
| 2005/0212609 A1* | 9/2005 | Jasa et al. | 331/116 R |
| 2006/0006431 A1* | 1/2006 | Jean et al. | 257/288 |

OTHER PUBLICATIONS

Su, C.Y. et al., "Scalable RF MIS varactor model," *Electronics Letters*, vol. 37 No. 12 (Jun. 7, 2001) pp. 760-761.

* cited by examiner

*Primary Examiner*—Matthew Smith
*Assistant Examiner*—Khiem Nguyen
(74) *Attorney, Agent, or Firm*—Slater & Matsil, L.L.P.

(57) ABSTRACT

Apparatus and method of providing a CMOS varactor device having improved linearity. At least two differential varactor elements are connected in parallel. Each of the differential elements includes first, second and third doped regions in a well. A first gate controls the first and second regions and a second gate controls the second and third regions. A resistor is formed such that power applied to the bulk region of the two differential elements will differ by the voltage drop across the resistor.

29 Claims, 7 Drawing Sheets

COMPENSATED LINEARITY VOLTAGE-CONTROL-CAPACITOR DEVICE BY STANDARD CMOS PROCESS

TECHNICAL FIELD

The present invention relates to varactor (or voltage controlled capacitors) devices and more specifically to a varactor using a multiplicity of parallel back-to-back CMOS devices to provide a large capacitance range over a large and substantially linear voltage range.

BACKGROUND

The capacitance and/or frequency of a varactor or Variable Voltage Capacitor varies directly as the applied voltage varies, and consequently finds significant application with oscillator circuits such as used in communication devices. As an example, an oscillator circuit that is controlled by a varactor offers high-speed operation, low noise and low power consumption. The operating frequency of such an oscillator can be controlled or tuned by varying the voltage across the terminals of the varactor and, therefore, ideally the varactor will have a high maximum to minimum capacitance ratio. This is because the difference between the maximum and minimum capacitance over the full range of the controlled voltage will be proportional to the tuning range of the oscillator. Thus, a large capacitance range results in a large tuning range of the oscillator. The ideal variable voltage capacitor will also operate substantially linearly over a large voltage range such that the oscillator changes its operating frequency smoothly over a large voltage range.

FIG. 1A illustrates the circuit schematic of an ideal LC oscillator (inductive capacitance) voltage controlled variable circuit or varactor, and FIG. 1B illustrates a linear relationship between the applied voltage $V_c$ (on the horizontal axis 10) and the operating frequency Hz of the oscillator (on the vertical axis 12). Unfortunately, as will be appreciated by those skilled in the art, semiconductor varactors or Variable Voltage Capacitors, simply do not demonstrate such a linear relationship.

Prior art semiconductor varactors are primarily of two types: a PN-junction varactor and a MOS varactor. The PN-junction varactor has the advantage that it can be implemented in a standard CMOS semiconductor process. Unfortunately, the PN-junction has a low maximum to minimum capacitance ratio, which, of course, as discussed above limits the operating frequency range of an oscillator using such a PN-junction varactor. On the other hand, a MOS varactor, such as shown in the semiconductor structure diagram of FIG. 2A and the electrical schematic of the back-to-back pair of varactors shown in FIG. 2B has an acceptable capacitance ratio, but the transition from the minimum $C_1$ to the maximum $C_2$ as shown in the graph of FIG. 2C from maximum to minimum or minimum to maximum, and as will be discussed later, is very abrupt over a small gate voltage (Vg) range $V_1$, $V_2$ such that the device is very non-linear.

One attempt to achieve the goal is described in U.S. Pat. No. 6,407,412 entitled "MOS Varactor Structure with Engineered Voltage Control Range" and issued to Krzysztof Iniewski, et al. on Jun. 18, 2002. However, the device requires a somewhat complicated process flow to provide the necessary P+ and N+ parallel-connected regions.

Therefore, it would be advantageous to provide a semiconductor varactor having a large capacitance ratio, which varies linearly over a large input voltage and can be manufactured by using standard CMOS processing.

SUMMARY OF THE INVENTION

These and other problems are generally solved or circumvented, and technical advantages are generally achieved, by embodiments of the present invention, which describes a method of forming a semiconductor varactor device having improved linearity. The method comprises the following steps. The device is formed on a semiconductor substrate and includes forming at least first and second differential varactor elements. Each of the differential varactor elements formed on the semiconductor substrate comprises forming first, second and third N+ doped regions in an N well and forming a first gate for controlling the first and second N+ doped regions and forming a second gate for controlling the second and third N+ doped regions. In addition, a first resistor is also formed on the semiconductor substrate to be connected to and receive power from a selected voltage source. The first resistor is formed so that after the first, second and third N+ doped regions of the first differential varactor elements receive power from the voltage source, the first, second and third N+ doped regions of the second differential varactor elements are connected to the other end of the first resistor such that there is a voltage drop across the first resistor before the power reaches the second differential varactor elements. According to one embodiment, the first and second gates are formed as N-type gates.

Although the forming of first and second (or two) differential varactor elements connected in parallel may be used to manufacture an improved oscillator according to this invention, it should be appreciated that even better linearity over a wider range of voltages may be achieved by using three or more differential varactor elements connected in parallel. That is, as many differential varactor elements as necessary may be connected in parallel according to the present invention so long as a series of resistors are also formed to control the bulk voltage of the regions of the differential varactor elements by connecting the resistors to provide a series of different voltage drops.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1A:
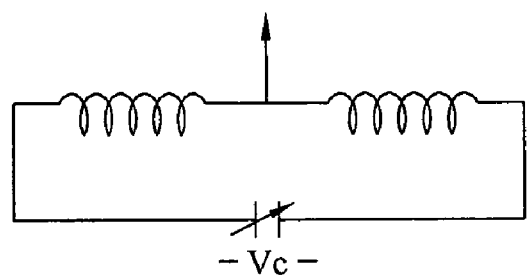
FIG. 1A illustrates the circuit schematic of an LC oscillator with ideal voltage controlled capacitor or varactor.
Figure 1B:
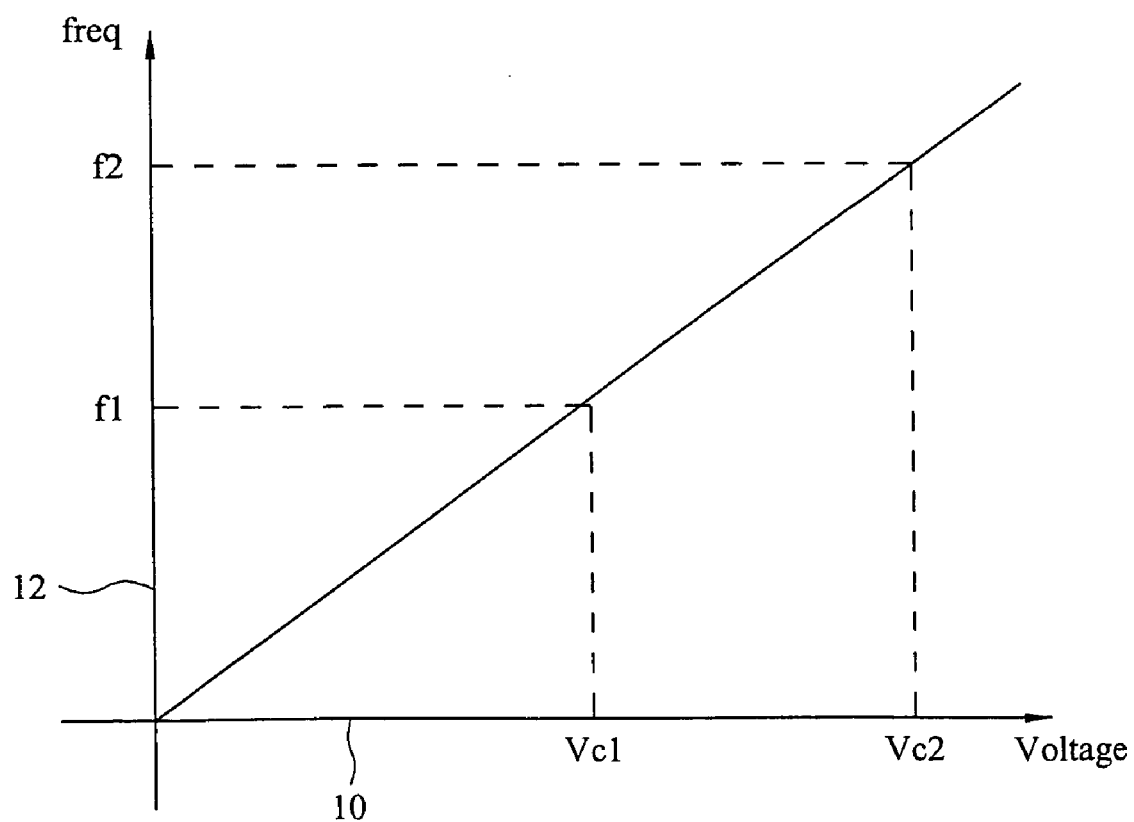
FIG. 1B illustrates the linear relationship between the applied voltage $V_c$ on the horizontal axis and the operating frequency Hz of the varactor on the vertical axis.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Referring again to FIG. 2A, there is shown a semiconductor variable capacitance circuit that may be used in an oscillator circuit. As shown, a standard CMOS process is used except that an N well 14 is formed in the semiconductor 16 rather than the typical P well. This may be achieved by simply changing the P well implant mask to an N well implant mask. N well 14 includes a couple of N+ regions 18a and 18b that are connected together to a voltage or bulk voltage source 20. A gate member 22 is formed between the N+ regions 18a and 18b such that a voltage can be applied to the gate 22 to control the operation of the circuit.

Figure 2A:
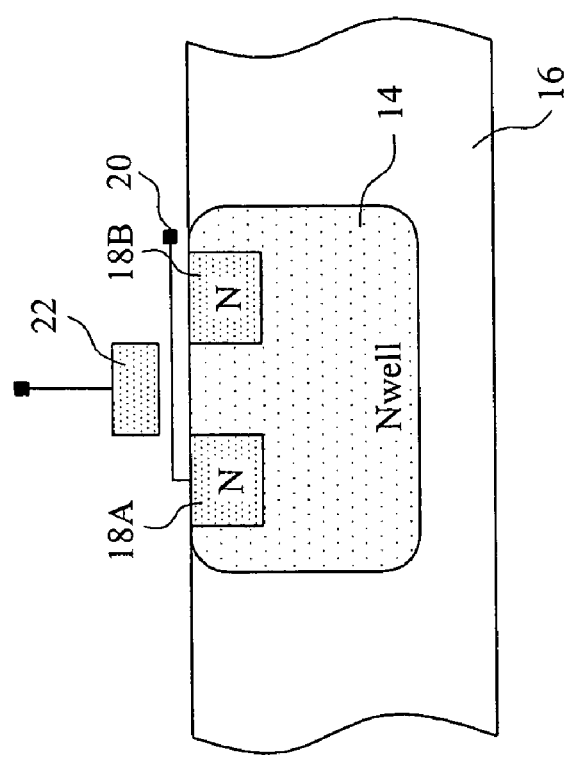
FIG. 2A is a prior art semiconductor structure portion of a single stage varactor.
Figure 2B:
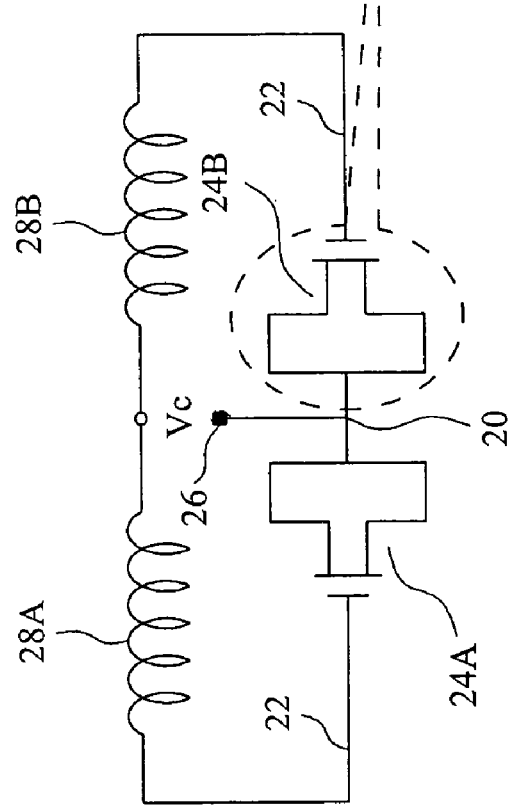
FIG. 2B is an electrical schematic of an oscillator with a pair of back-to-back varactors having the prior art structure of FIG. 2A.
Figure 2C:
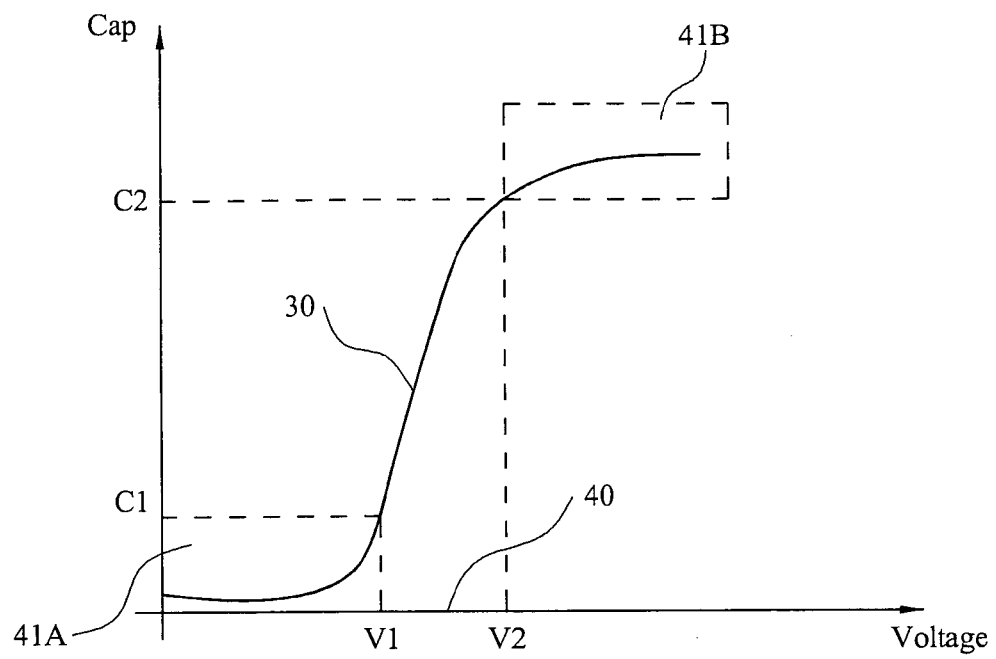
FIG. 2C is a graph illustrating the steep rise in capacitance with respect to voltage changes of the varactor of FIGS. 2A and 2B.

Referring to FIG. 2B, there is shown an LC oscillator circuit, which includes two of the circuits shown in FIG. 2A and identified in the circuit of FIG. 2B as circuits 24a and 24b. As shown, these circuits are connected as back-to-back differential varactor circuits with the bulk voltage Vc being applied to terminal 26. Therefore, as will be appreciated by those skilled in the art, when the back-to-back varactor elements are connected in parallel to an inductive element, such as inductive elements 28a and 28b, an LC circuit having a linear portion is provided. The variable capacitance of the circuit of the device shown in FIG. 2B is illustrated in FIG. 2C. As can be seen, a graph of the capacitance vs. voltage of such a circuit has a linear area 30 of capacitance change between a small voltage change 40 between voltages $V_1$ and $V_2$. At each side of the linear change 30, however, there is very little change in the capacitance with increase in voltage as seen in areas 41a and 41b. As was discussed before, it is desirable for an oscillator used in communications to have a variable capacitor that varies substantially linear over a wide range of voltages. Such a linear change over a wide voltage range allows for easy tuning of a communication circuit. Therefore, although the graph indicates a linear area 30 in FIG. 2C, the change in capacitance occurs over the very small voltage range (between $V_1$ and $V_2$), which makes it difficult to provide discrete changes in the capacitance.

Various attempts have been made to solve this problem. For example, referring to FIG. 3A there is shown three circuits of the type discussed above with respect to FIG. 2A and FIG. 2B except that the bulk voltage V of each of the three circuits is different as indicated at $V_1$, $V_2$ and $V_3$.

Figure 3A:
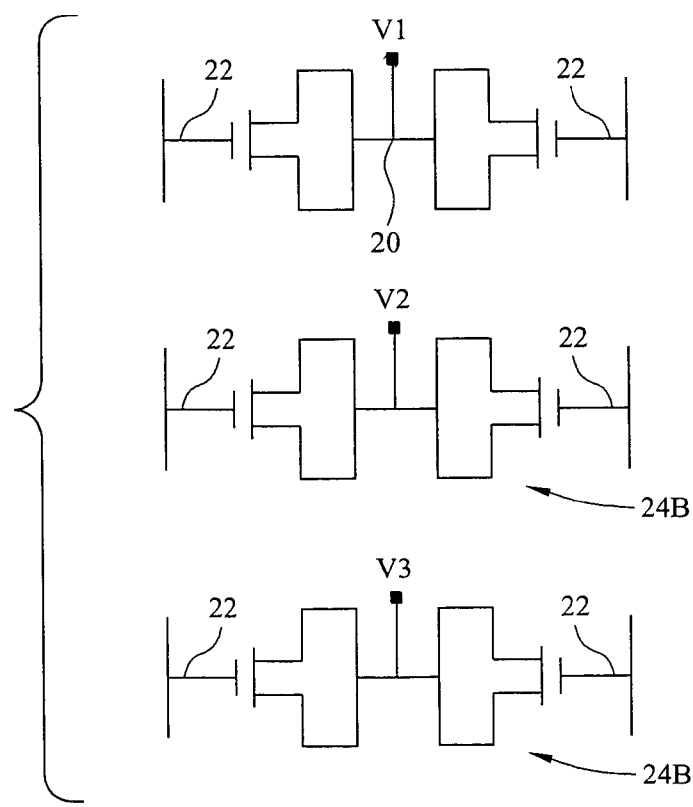
FIG. 3A illustrates electrical schematics of three varactors of the prior art semiconductor structure of FIG. 2A having three different bulk bias voltages applied to the structure.
Figure 3B:
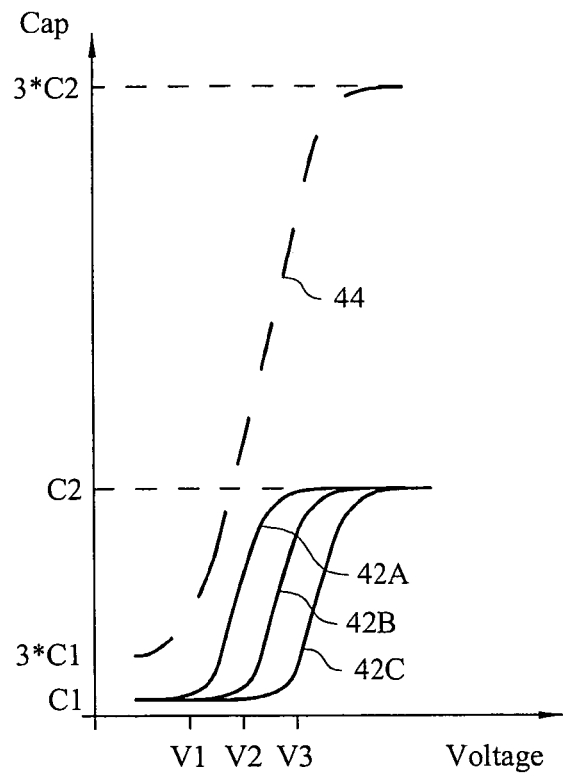
FIG. 3B shows the three steep capacitance vs. voltage curves of the circuits of FIG. 3A as solid line graphs.

The solid line curves 42a, 42b and 42c of FIG. 3B illustrate how the voltages for the three circuits of FIG. 3A are optimally selected.

Figure 3C:
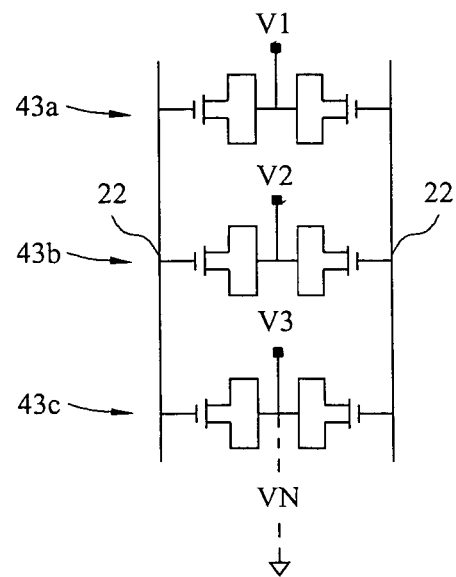
FIG. 3C is an electrical schematic of the three circuits of FIG. 3A connected in parallel.

Referring to FIG. 3C, there is illustrated an electrical schematic of three circuits 43A, 43B and 43C similar to those of FIG. 3A connected in parallel according to the present invention. As discussed above, the solid line graphs of FIG. 3B illustrate the different outputs of the three circuits 43a, 43b and 43c of FIG. 3C when the voltages $V_1$, $V_2$ and $V_3$ are optimally selected. The dashed line curve 44 of FIG. 3B illustrates the combined outputs of the three circuits when the voltages $V_1$, $V_2$ and $V_3$ are optimally selected and the circuits are connected in parallel.

Figure 4A:
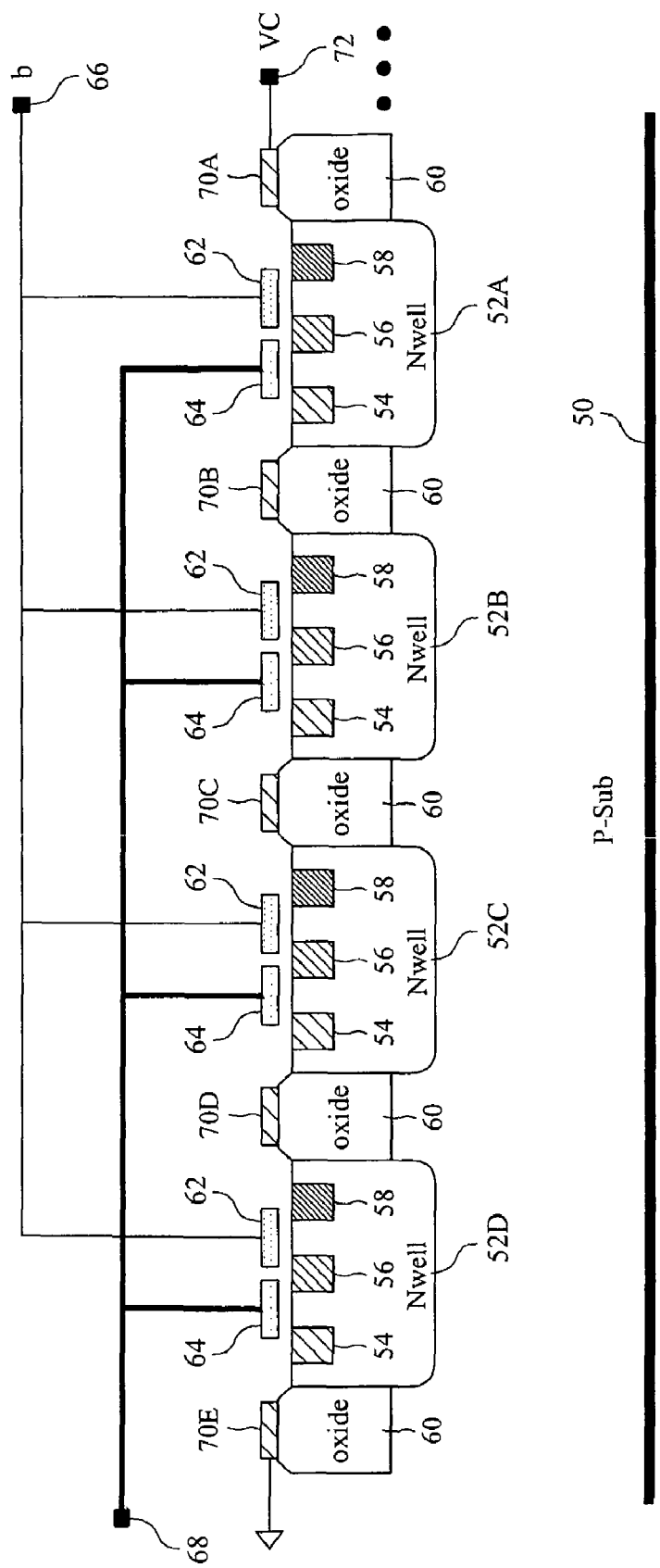
FIG. 4A is a cross-sectional view of a semiconductor structure of back-to-back varactors according to the present invention and having a capacitance voltage output similar to that shown in FIG. 4D.
Figure 4B:
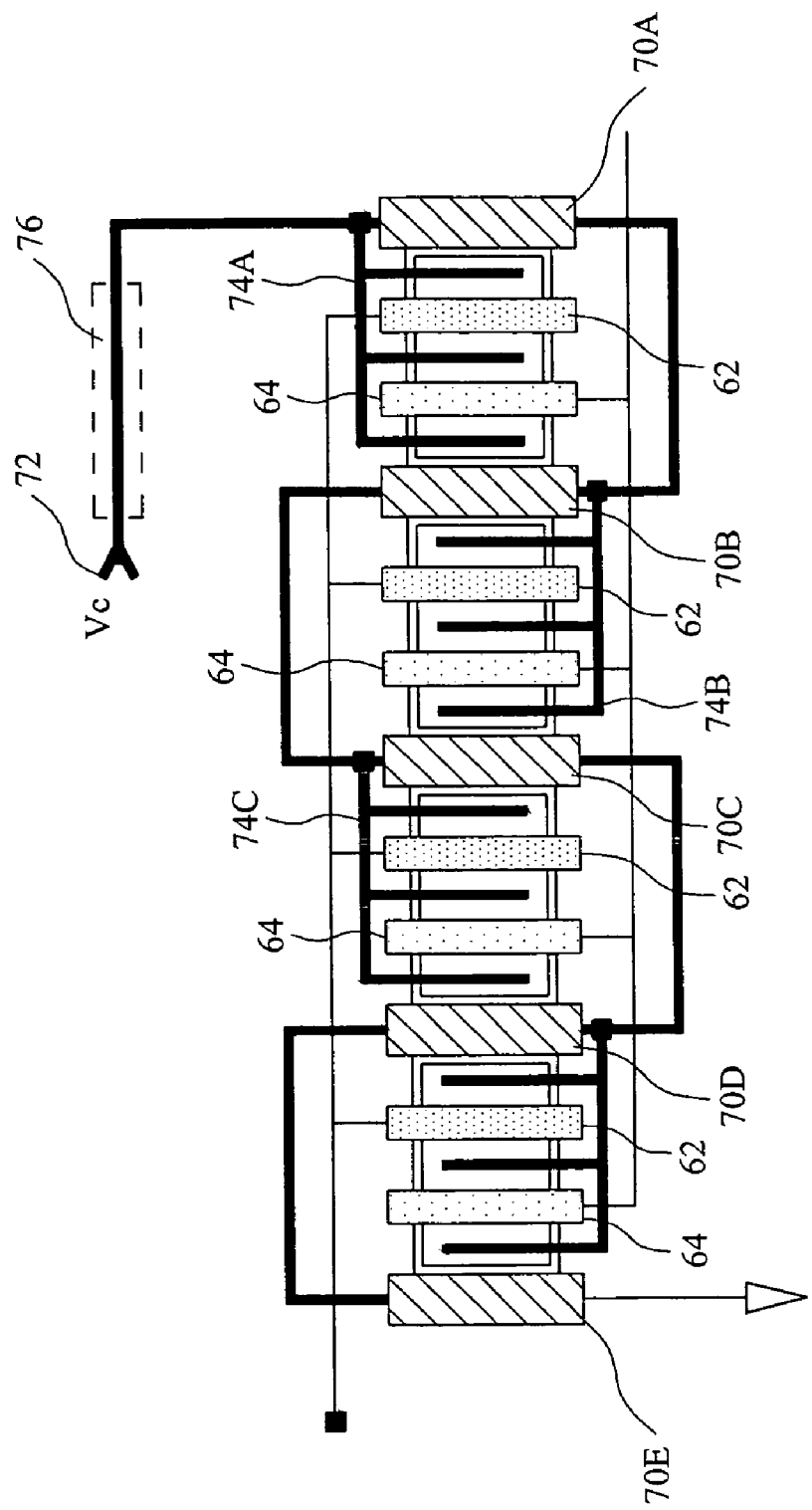
FIG. 4B is a top view of the semiconductor structure of FIG. 4A.

Referring now to FIGS. 4A and 4B, there are shown a cross-sectional view and a top view of a semiconductor structure incorporating the teachings of the present invention. As shown, the structure is built upon a P-type substrate 50, which, according to the present embodiment, includes four N well areas 52a, 52b, 52c and 52d. Each of the N wells includes a first region 54, a second region 56 and a third region 58 all of which are N+ regions within the N wells 52a–52d. Silicon oxide areas 60 are shown separating each of the N wells 52a–52d. A first gate 62 above each of the N wells will control the electron flow between the first and second N+ regions 54 and 56 whereas a second gate 64 will control electron flow between the second and third regions 56 and 58. All of the first gates 62 are connected in parallel and have a common output terminal 66. Likewise, each of the second gates 64 is also connected in parallel and have a common output terminal 68. Further, although the above discussions, as well as the following discussions are with respect to N well varactors, it is also possible to include a PMOS-like varactor by forming P+ doped regions in a P well with first and second gate members.

There is also included a group of resistors 70a, 70b, 70c, 70d and 70e, connected in series as is better shown in FIG. 4B. These serially connected resistors, as will be discussed hereinafter, provide a series of voltage drops so that each of the N wells 52a–52d has a different bulk voltage. This can be seen better in FIG. 4B wherein a voltage terminal 72 receives voltage from a voltage source, not shown, and this voltage is provided to the bulk region of N well 52a as shown by the connections 74a more clearly seen in FIG. 4B. The resistor 70a is also connected to the voltage source 72 and, in turn, it creates a voltage drop such that a second and lower voltage is provided to the N well 52b as indicated by electrical connections 74b. A second resistor 70b provides a second voltage drop to the N well 52c by the connections 74c. In a similar manner, resistors 70c, 70d and 70e provide additional voltage drops to the N well 52d and any other N wells. Resistors 70d and 70e illustrate that other additional N wells may be included in the circuitry. It is also possible of course, that another resistor be included between the voltage source 72 and the first bulk region 52a, such as resistor 76 shown in dashed lines in FIG. 4B to drop the voltage from that received from source 72 before it is applied to the first N well 52a.

Figure 4C:
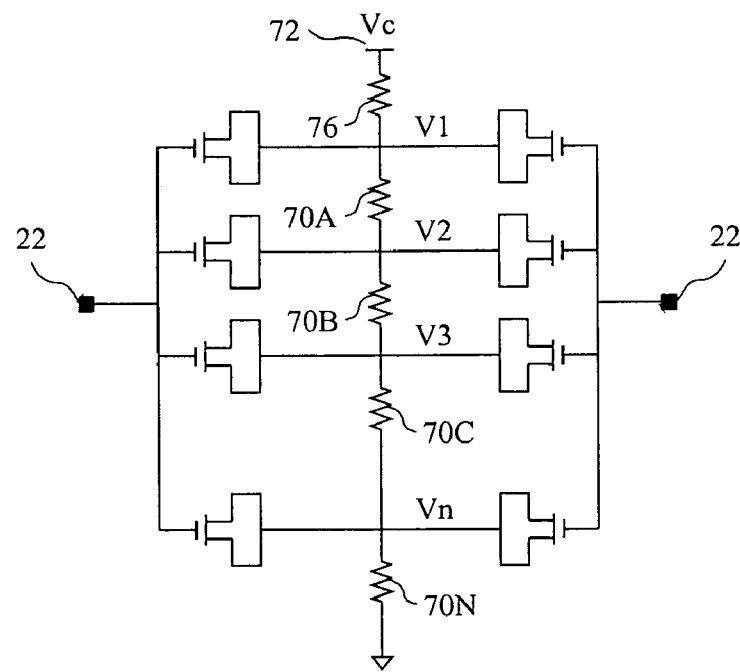
FIG. 4C is an electrical schematic illustrating the semiconductor structure of FIGS. 4A and 4B of a plurality of back-to-back varactors according to the present invention.
Figure 4D:
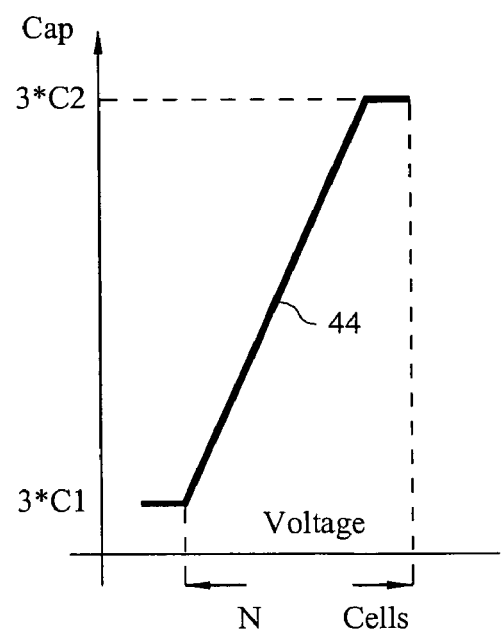
FIG. 4D is a graph illustrating the idealized resulting capacitance to voltage curve achieved by the present invention when a plurality of different optimized voltages are applied to the bulk region of the electrical schematic of FIG. 4A.

Therefore, referring now to FIG. 4C, there is shown an electrical schematic of a plurality of back-to-back varactors of the type shown in FIGS. 4A and 4B and similar to that of FIG. 3C, except that there is included the resistors 70a, 70b, 70c, $70_N$ and 76 for providing voltage drops such that each of the back-to-back differential varactors is operating at a different bulk voltage. Consequently, if these resistors are optimally selected to provide specific voltage drops, the plurality of back-to-back vectors connected in parallel will generate a capacitance to voltage output similar to curve 44 shown in FIG. 4D.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor varactor device having improved linearity comprising the steps of:
   providing a semiconductor substrate;
   forming at least a first and a second differential varactor element on said semiconductor substrate, the forming of each of said differential varactor elements comprising the steps of forming first, second and third N+ doped regions in the same N well, forming a first gate for controlling said first and second N+ doped regions and forming a second gate for controlling said second and third N+ doped regions;
   connecting said first, second and third N+ doped regions of said first differential varactor element to receive power having the same first voltage; and
   connecting said first, second and third N+ doped regions of said second differential varactor element to receive power having the same second voltage, said second voltage being different than said first voltage.

2. The method of claim 1 further comprising fanning a first resistor, having a first terminal and a second terminal in said semiconductor varactor device connected to receive power from a voltage source, and wherein said step of connecting said first, second and third N+ doped regions of said first differential varactor composes connecting said regions to said voltage source and to said first terminal of said first resistor, and wherein said step of connecting said first, second and third N+ doped regions of said second differential varactor comprises connecting to said second terminal of said first resistor so that power from said voltage source received at said second differential varactor passes through said first resister resulting in a voltage drop.

3. The method of claim 1 wherein said step of forming said first and second gates comprises the step of forming a first N-type gate and forming a second N-type gate.

4. The method of claim 2 wherein said step of forming a first resistor comprises the step of forming another resistor and said first resistor and wherein said another resistor is connected in series and between said voltage source and said first resistor, wherein said step of connecting said first, second and third N+ doped regions of said first differential varactor element to receive power from said voltage source comprises the step of connecting said regions to said voltage source through said another resistor, and such that said second differential varactor elements receive power from said voltage source through both of said another and said first resistors.

5. The method of claim 2 wherein said step of forming at least a first and a second differential varactor element comprises the step of forming at least a first, a second and a third differential varactor element, wherein said step of forming a first resistor comprises the step of forming first and second resistors connected in series and further comprising the step of connecting said first, second and third N+ doped regions of said third differential varactor element to receive power from said voltage source through both of said first and second resistors.

6. The method of claim 5 wherein said step of forming first and second resistors comprises the step of forming another resistor and said first and second resistors and wherein said another resistor is connected in series between said voltage source and said first and second resistors and wherein said step of connecting said first, second and third N+ doped regions of said first differential varactor element to receive power from said voltage source comprises the step of connecting said voltage source to said regions through said another resistor.

7. The method of claim 2 wherein said step of fanning first end second differential varactor elements comprises the step of forming a plurality of differential varactor elements, wherein said step of forming a first resistor comprises the step of forming a plurality of resistors connected in series such that nodes are defined between adjacent ones of said serially connected plurality of resistors and further comprising the step of connecting said first, second and third N+ doped regions of one each of said plurality of differential varactor elements to one each of said nodes such that said first, second and third N+ doped regions of different ones of said plurality of differential varactor elements are electrically separated by one of said plurality of resistors.

8. The method of claim 7 wherein said step of forming a plurality of resistors further comprises the step of forming said plurality of resistors and another resistor and connecting said another resistor in series between said voltage source and said serially connected plurality of resistors and wherein said step of connecting said first differential varactor element to receive power from said voltage source comprises the step of connecting said voltage source to said varactor element through said another resistor.

9. The method of claim 1 further comprising the steps of connecting said first gate of said first and second differential varactor elements together at a first terminal and connecting said second gate of said first and second differential varactor elements together at a second terminal.

10. The method of claim 5 further comprising the steps of connecting said first gate of said first, second and third differential varactor elements together at a first terminal and connecting said second gate of said first, second and third differential varactor element together at a second terminal.

11. The method of claim 7 further comprising the steps of connecting said first gate of said plurality of differential varactor elements together at a first terminal and connecting said second gate of said plurality of differential varactor elements together at a second terminal.

12. The method of claim 9 further comprising connecting said first and second terminals to an oscillator circuit as a voltage controlled capacitor.

13. The method of claim 11 further comprising connecting said first and second terminals to an oscillator circuit as a voltage controlled capacitor.

14. The method of claim 1 wherein said fanning steps are according to a CMOS process.

15. The method of claim 9 wherein said first and second gates are N-type gates.

16. The method of claim 10 wherein said first and second gates are N-type gates.

17. The method of claim 11 wherein said first and second gates are N-type gates.

18. The method of claim 1 further comprising the steps of forming another differential varactor element on said semiconductor, said another differential varactor element comprising first, second and third P+ doped regions in a P well, a first gate for controlling said first and second P+ doped regions and a second gate for controlling said second and third P+doped regions, and connecting said first, second and third P+ doped regions to receive power from said voltage source.

19. The method of claim 2 wherein said step of forming a first resistor comprises the step of forming said first resistor from a polysilicon material.

20. The method of claim 11 further comprising connecting said first and second terminals to an oscillator circuit as a voltage controlled capacitor.

21. The method of claim 11 wherein said first and second gates are N-type gates.

22. A method of forming a semiconductor varactor device having improved linearity comprising the steps of:
providing a semiconductor substrate;
forming at least a first, second, and third differential varactor element on said semiconductor substrate, the forming of each of said differential varactor elements comprising the steps of forming first, second and third N+ doped regions in an N well, forming a first gate for controlling said first and second N+ doped regions and forming a second gate for controlling said second and third N+ doped regions;
forming a first and a second resistor in said substrate connected in series and connected to receive power form a voltage source
connecting said first, second and third N+ doped regions of said first differential varactor element to receive power having a first voltage;
connecting said first, second and third N+ doped regions of said second differential varactor element to said voltage source through said first resistor so as to receive power having a second voltage different than said first voltage; and
connecting said first, second, and third N+ doped regions of said third differential varactor element to said voltage source through both of said first and second resistors so as to receive power having a third voltage.

23. The method of claim 22 wherein said step of forming first and second resistors comprises the step of forming another resistor and said first and second resistors and wherein said another resistor is connected in series between said voltage source and said first and second resistors and wherein said step of connecting said first, second and third N+ doped regions of said first differential varactor element to receive power from said voltage source comprises the step of connecting said voltage source to said regions through said another resistor.

24. The method of claim 22 further comprising the steps of connecting said first gate of said first, second and third differential varactor elements together at a first terminal and connecting said second gate of said first, second and third differential varactor element together at a second terminal.

25. The method of claim 24 wherein said first and second gates are N-type gates.

26. A method of forming a semiconductor varactor device having improved linearity comprising the steps of:
providing a semiconductor substrate;
forming at least a plurality of differential varactor element on said semiconductor substrate, the forming of each of said differential varactor elements comprising the steps of forming first, second and third N+ doped regions in an N well, forming a first gate for controlling said first ad second N+ doped regions and forming a second gate for controlling said second and third N+ doped regions;
forming a plurality of resistors connected to receive power form a voltage source and connected in series such that nodes are defined between adjacent ones of said serially connected plurality of resistors; and
connecting said first second and third N+ doped regions of each of said plurality of differential varactor elements to one each of said nodes such that said first, second and third N+doped regions of different ones of said plurality of differential varactor elements are electrically separated by one of said plurality of resistors.

27. The method of claim 26 wherein said step of forming a plurality of resistors further comprises the step of forming said plurality of resistors and another resistor and connecting said another resistor in series between said voltage source and said serially connected plurality of resistors.

28. The method of claim 26 further comprising the steps of connecting said first gate of said plurality of differential varactor elements together at a first terminal and connecting said second gate of said plurality of differential varactor elements together at a second terminal.

29. A method of forming a semiconductor varactor device having improved linearity comprising the steps of:
providing a semiconductor substrate;
forming at least a first, second, and third differential varactor element on said semiconductor substrate, the forming of each of said differential varactor elements comprising the steps of forming first, second and third N+ doped regions in the same N well, forming a first gate for controlling said first and second N+ doped regions and forming a second gate for controlling said second and third N+ doped regions;
connecting said first, second and third N+ doped regions of said first differential varactor element together so as to receive power having the same first voltage;
connecting said first, second and third N+ doped regions of said second differential varactor element together so as to receive power having the second voltage, said second voltage being different than said first voltage;
connecting said first, second, and third N+ doped regions of said third differential varactor element together so as to receive power having the same third voltage, said third voltage being different than either of said first and second voltage.

* * * * *

UNITED STATES PATENT AND TRADEMARK OFFICE
CERTIFICATE OF CORRECTION

| | | |
|---|---|---|
| PATENT NO. | : 7,223,667 B2 | Page 1 of 1 |
| APPLICATION NO. | : 10/828884 | |
| DATED | : May 29, 2007 | |
| INVENTOR(S) | : Tseng | |

It is certified that error appears in the above-identified patent and that said Letters Patent is hereby corrected as shown below:

Column 5, line 30; delete "clement" insert --element--
Column 5, line 44; delete "fanning" insert --forming--
Column 6, line 25; delete "fanning" insert --forming--
Column 6, line 26; delete "end" insert --and--
Column 7, line 1; delete "fanning" insert --forming --

Signed and Sealed this

Seventh Day of August, 2007

JON W. DUDAS
*Director of the United States Patent and Trademark Office*